(12) United States Patent
Chung et al.

(10) Patent No.: US 9,722,098 B1
(45) Date of Patent: Aug. 1, 2017

(54) SEMICONDUCTOR DEVICE PACKAGE AND METHOD OF MANUFACTURING THE SAME (71) Applicant: ASE ELECTRONICS (M) SDN BHD, Bayan Lepas, Penang (MY)

(72) Inventors: Kam Cheong Chung, Paya Terubong (MY); Ahmad Zulmuhtasyim, Bayan Lepas (MY); Liang Peng Cheng, Gelugor (MY); Lai Theng Chan, Balik Pulau (MY)

(73) Assignee: ASE ELECTRONICS (M) SDN BHD, Bayan Lepas (MY)

( * ) Notice: Subject to any disclaimer, the term of this patent is extended or adjusted under 35 U.S.C. 154(b) by 0 days.

(21) Appl. No.: 15/296,911

(22) Filed: Oct. 18, 2016

(51) Int. Cl.
  H01L 23/31    (2006.01)
  H01L 31/0203  (2014.01)
  H01L 31/02    (2006.01)
  H01L 33/48    (2010.01)
  H01L 33/54    (2010.01)
  H01L 33/62    (2010.01)
  H01L 31/18    (2006.01)
  H01L 23/552   (2006.01)

(52) U.S. Cl.
  CPC ...... *H01L 31/0203* (2013.01); *H01L 23/3157* (2013.01); *H01L 23/552* (2013.01); *H01L 31/02005* (2013.01); *H01L 31/18* (2013.01); *H01L 33/483* (2013.01); *H01L 33/54* (2013.01); *H01L 33/62* (2013.01); *H01L 2933/005* (2013.01); *H01L 2933/0066* (2013.01)

(58) Field of Classification Search
  CPC .............. H01L 21/4817; H01L 23/22
  See application file for complete search history.

(56) References Cited

U.S. PATENT DOCUMENTS

| | | | |
|---|---|---|---|
| 6,057,597 A  | 5/2000  | Farnworth et al. |
| 6,143,588 A  | 11/2000 | Glenn |
| 6,531,333 B2 | 3/2003  | Lin et al. |
| 6,586,824 B1 | 7/2003  | Glenn et al. |
| 6,590,269 B1 | 7/2003  | Chuang et al. |
| 6,686,667 B2 | 2/2004  | Chen et al. |
| 6,934,065 B2 | 8/2005  | Kinsman |
| 7,026,710 B2 | 4/2006  | Coyle et al. |
| 7,199,438 B2 | 4/2007  | Appelt et al. |
| 7,939,901 B2 | 5/2011  | Minamio et al. |

*Primary Examiner* — Cheung Lee
(74) *Attorney, Agent, or Firm* — Foley & Lardner LLP; Cliff Z. Liu (57) ABSTRACT

A method of manufacturing a semiconductor device package includes disposing at least one die over a substrate, dispensing a liquid material on the die, and curing the liquid material so that the liquid material forms a protective layer attached to a portion of the die. The method further includes forming an encapsulant covering at least a portion of the substrate and a portion of the die, where the protective layer is exposed from the encapsulant in a cavity defined by the encapsulant. The method further includes removing the protective layer from the die, and disposing a cap over the cavity.

20 Claims, 10 Drawing Sheets

SEMICONDUCTOR DEVICE PACKAGE AND METHOD OF MANUFACTURING THE SAME

BACKGROUND

1. Technical Field

The present disclosure relates to a semiconductor device package and method of manufacturing the same, and more particularly, to a semiconductor device package and a method of manufacturing the semiconductor device package using a temporary protective layer formed by a curable liquid material to protect a die during a manufacturing process.

2. Description of the Related Art

Optoelectronic devices such as image sensors are increasingly in demand for incorporation into electronic devices. The optoelectronic devices may be used for a variety of applications including digital cameras, smart phones, displays and other consumer electronics.

To protect an optoelectronic die of an optoelectronic device from physical damage in an environment and from contaminants in the environment, the optoelectronic die may be enclosed within a cavity in a package, and a transparent cover may be disposed over the cavity to allow light to pass through so that the optoelectronic die is able to sense incident light through the transparent cover. An encapsulant may also be used within the package and around the optoelectronic die.

The optoelectronic die, however, can be damaged during a packaging process, which can adversely affect yield and reliability of the optoelectronic device. In addition, the optoelectronic device package as described above is bulky, which does not correspond to miniaturization trends for consumer electronics.

SUMMARY

In one or more embodiments, a method of manufacturing a semiconductor device package includes disposing at least one die over a substrate, dispensing a liquid material on the die, and curing the liquid material so that the liquid material forms a protective layer attached to a portion of the die. The method further includes forming an encapsulant covering at least a portion of the substrate and a portion of the die free of the protective layer, where the protective layer is exposed from the encapsulant in a cavity defined by the encapsulant. The method further includes removing the protective layer from the die, and disposing a cap over the cavity.

In one or more embodiments, a method of manufacturing an optoelectronic device package includes disposing at least one optoelectronic die including an optical element over a substrate, dispensing a resin material on the optoelectronic die, and curing the resin material so that the resin material forms a protective layer covering the optical element of the optoelectronic die. The method further includes forming a molding member defining a cavity over the substrate and the optoelectronic die, the cavity exposing the protective layer. The method further includes removing the protective layer from the die and disposing an electromagnetic radiation transmissive cap over the cavity.

In one or more embodiments, a semiconductor device package includes a substrate, a die disposed over the substrate, conductive components electrically connecting the die to the substrate, an encapsulant, and an electromagnetic radiation transmissive cap. The encapsulant is disposed over the substrate and defines a cavity partially exposing an upper surface of the die, the cavity including a stepped sidewall. The stepped sidewall includes an inclined portion extending to the upper surface of the die, the inclined portion inclined outwardly with respect to the upper surface of the die, a vertical portion extending from an upper surface of the encapsulant, the vertical portion being substantially perpendicular to the upper surface of the encapsulant, and a ledge portion between the vertical portion and the inclined portion and substantially parallel to the upper surface of the encapsulant. The electromagnetic radiation transmissive cap is disposed on the ledge portion and is surrounded by the vertical portion.

BRIEF DESCRIPTION OF THE DRAWINGS

Aspects of the present disclosure are best understood from the following detailed description when read with the accompanying figures. It is noted that various structures may not be drawn to scale, and the dimensions of the various structures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over", "above," "upper", "on" and the like, may be used herein for ease of description to describe one component or feature's relationship to another component(s) or feature(s) as illustrated in the figures. The present disclosure is intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following description is directed to a semiconductor device package and method of manufacturing the same. The semiconductor device may be one of various types of devices such as an optoelectronic device or a micro electromechanical system (MEMS) device. The optoelectronic device may include an optoelectronic die, for example, an electromagnetic radiation responsive die or an electromagnetic radiation emitting die. The term "electromagnetic radiation responsive die" is used throughout to encompass a die sensitive to various wavelengths of visible light and/or other forms of electromagnetic radiation, including, but not limited to, a charged coupled device (CCD), a complementary metal-oxide semiconductor (CMOS) image sensor, an erasable programmable read-only memory (EPROM), and a photodiode. The term "electromagnetic radiation emitting die" is used throughout to encompass a die able to emit various wavelengths of visible light and/or other forms of electromagnetic radiation, including, but not limited to, a light-emitting diode (LED) and an organic LED (OLED).

Figure 1:
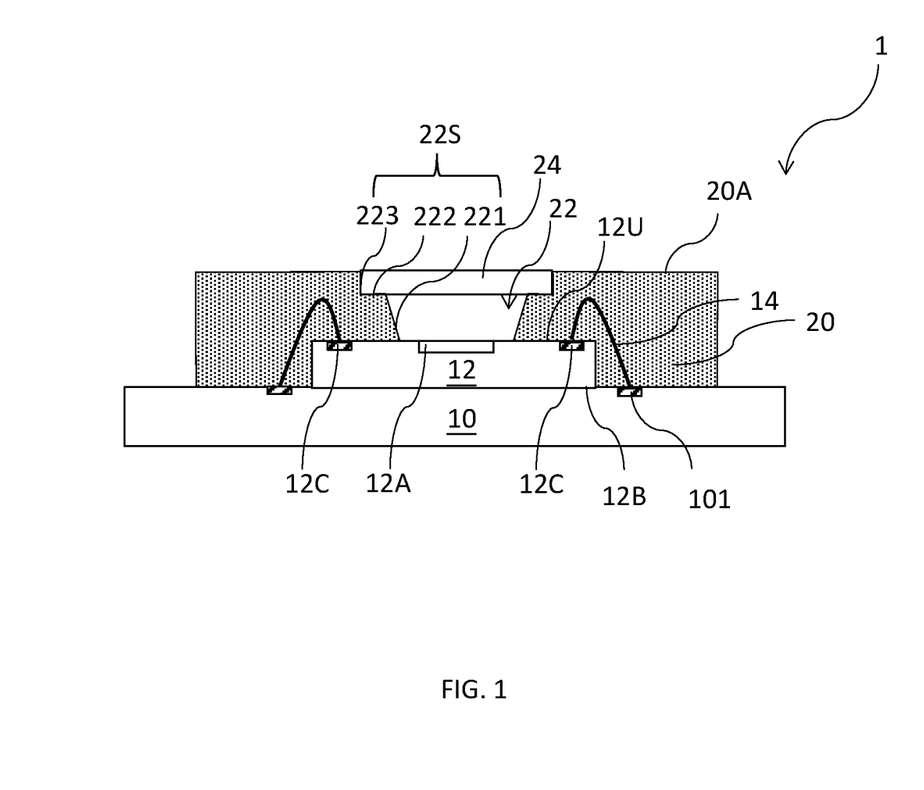
FIG. 1 is a cross-sectional view of a semiconductor device package in accordance with an embodiment of the present disclosure.

FIG. 1 is a cross-sectional view of a semiconductor device package 1 in accordance with an embodiment of the present disclosure. As shown in FIG. 1, the semiconductor device package 1 includes a substrate 10, a die 12, conductive components 14, an encapsulant 20 and a cap 24. The substrate 10 may include bonding pads 101 configured to electrically connect to the die 12. The substrate 10 may be, for example, a printed circuit board, an interposer, a lead frame or any other suitable substrate. The die 12 is disposed over the substrate 10. In one or more embodiments, a bottom surface 12B of the die 12 is attached to the surface of the substrate 10 with an adhesive material (not shown) such as epoxy or other suitable adhesive material. In other embodiments, the surface 12B of the die 12 is disposed directly on the surface of the substrate 10 without an adhesive material. The die 12 includes contacts 12C electrically connected to an integrated circuit (not shown) in the die 12 and configured as electrical terminals of the integrated circuit. In one or more embodiments, the contacts 12C are disposed on an upper surface 12U of the die 12.

In one or more embodiments, the die 12 is an optoelectronic die such as an electromagnetic radiation responsive die or an electromagnetic radiation emitting die. The optoelectronic die includes an optical element 12A. When the die 12 is an electromagnetic radiation responsive die, the optical element 12A may be an electromagnetic radiation responsive element sensitive to incident light. When the optoelectronic die is an electromagnetic radiation emitting die, the optical element 12A may be an electromagnetic radiation emitting element able to emit light. In other embodiments, the die 12 may include a semiconductor die, a MEMS die, or other type of die configured to provide different functionalities. Although a single die 12 is illustrated in FIG. 1, multiple dies 12 may be incorporated into the semiconductor device package 1.

The conductive components 14 are illustrated in FIG. 1 as bond wires connecting the contacts 12C of the die 12 to the bonding pads 101 of the substrate 10. It is to be understood, however, that other types of conductive components 14 may alternatively or additionally be used, such as, but not limited to, solder bumps, pillars, or the like. For example, the contacts 12C may be disposed on the bottom surface 12B of the die 12, and the conductive components 14 may electrically connect the contacts 12C on the bottom surface 12B of the die 12 to the bonding pads 101 of the substrate 10; however, in other embodiments, the conductive components 14 are omitted, and the contacts 12C on the bottom surface 12B of the die 12 are bonded directly to the bonding pads 101 of the substrate 10, such as by ultrasonic welding or other technique.

The encapsulant 20 is disposed over a portion of the substrate 10 and over the die 12 to encapsulate a portion of the die 12. The encapsulant 20 includes an upper surface 20A, and the encapsulant 20 defines a cavity 22 from the upper surface 20A that partially exposes the upper surface 12U of the die 12. The optical element 12A of the die 12 is fully exposed by the cavity 22. The encapsulant 20 encapsulates the conductive components 14 to protect the conductive components 14. In one or more embodiments, the upper surface 20A of the encapsulant 20 is a planar surface. The cavity 22 includes a stepped sidewall 22S including an inclined portion 221, a ledge portion 222 and a vertical portion 223. The inclined portion 221 extends to the upper surface 12U of the die 12, and the inclined portion 221 is inclined outwardly with respect to the optical element 12A. The vertical portion 223 is substantially perpendicular to the upper surface 20A of the encapsulant 20, and the ledge portion 222 is substantially parallel to the upper surface 20A of the encapsulant 20; thus the vertical portion 223 and the ledge portion 222 are substantially perpendicular to each other along a periphery of the cavity 22. The cavity 22 may have any cross-sectional shape, and the cross-sectional shape may vary along a depth of the cavity 22.

In one or more embodiments, perimeters of the inclined portion 221, the ledge portion 222 and the vertical portion 223 are substantially rectangular in shape along the depth of the cavity 22 when viewed from the top (in the orientation of FIG. 1). In such embodiments, each of the inclined portion 221, the ledge portion 222 and the vertical portion 223 includes four planar surfaces; the four planar surfaces of the vertical portion 223 extend from the upper surface 20A of the encapsulant 20 to the ledge portion 222, the four planar surfaces of the inclined portion 221 extend from the ledge portion 222 to the upper surface 12U of the die 12, and each of the four planar surfaces of the ledge portion 222 extend between a corresponding planar surface of the vertical portion 223 and a corresponding planar surface of the inclined portion 221.

In one more embodiments, a perimeter of the cavity 22 is substantially circular from the upper surface 20A of the encapsulant 20 to the upper surface 12U of the die 12; thus, the cavity 22 has a substantially conical shape along the inclined portion 221 of the sidewall 22S, and a substantially columnar shape along the vertical portion 223 of the sidewall 22S, where the ledge portion 222 of the sidewall 22S forms a substantially annular ring between the inclined portion 221 and the vertical portion 223.

The cap 24 is disposed on the ledge portion 222 and is surrounded by the vertical portion 223. The cap 24 may optionally be attached to the ledge portion 222 with an adhesive material (not shown). In one or more embodiments, the cap 24 is hermetically sealed to the encapsulant 20 to enclose the cavity 22, thereby inhibiting or preventing moisture and contaminants from entering the cavity 22. In one or more embodiments of a semiconductor device package 1 in which the die 12 is an optoelectronic die, the cap 24 is electromagnetic radiation transmissive, allowing electromagnetic radiation within a predetermined range of wavelengths to pass. For example, the cap 24 may be a transparent material which allows visible light to pass.

Figure 2A:
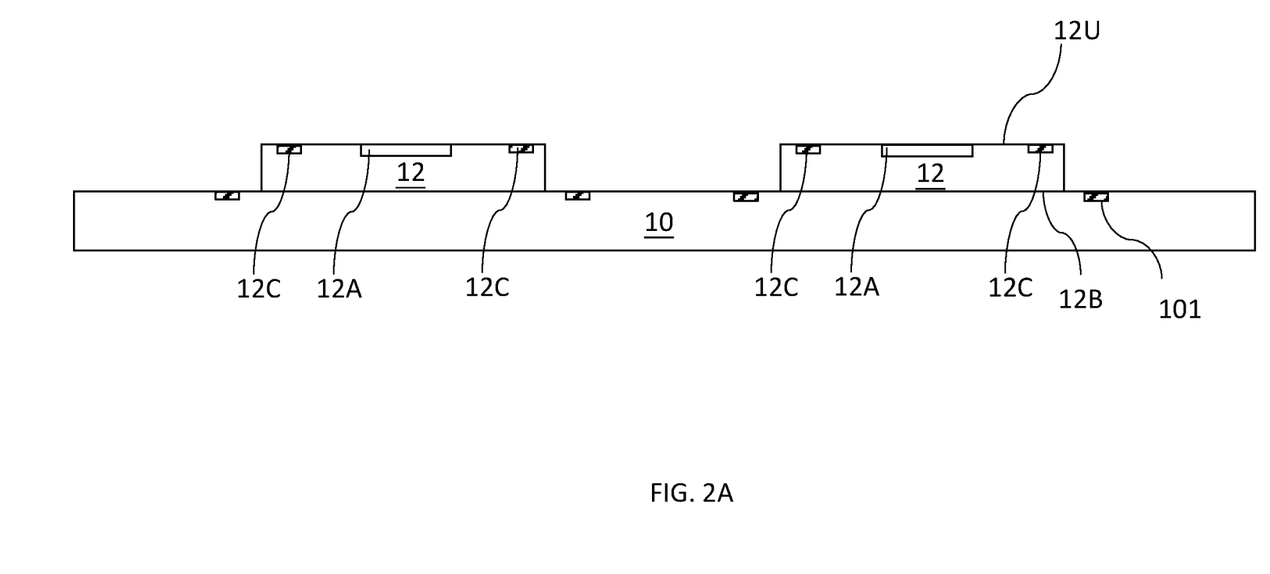
FIG. 2A, FIG. 2B, FIG. 2C, FIG. 2D, FIG. 2E, FIG. 2F, FIG. 2G, FIG. 2H and FIG. 2I illustrate a method of manufacturing a semiconductor device package in accordance with an embodiment of the present disclosure.

FIGS. 2A-2I illustrate a method of manufacturing a semiconductor device package in accordance with an embodiment of the present disclosure. Referring to FIG. 2A, one or more dies 12 are disposed over a substrate 10. In one or more embodiments, a bottom surface 12B of each of the dies 12 is attached to a surface of the substrate 10 with or without an adhesive material. The substrate 10 may be, or may include, a printed circuit board, an interposer, a lead frame or any other suitable substrate. In one or more embodiments, the substrate 10 may include bonding pads 101. In one or more embodiments, each of the dies 12 is an optoelectronic die, which includes an optical element 12A at an upper surface 12U of the optoelectronic die and one or more contacts 12C around the optical element 12A.

Figure 2B:
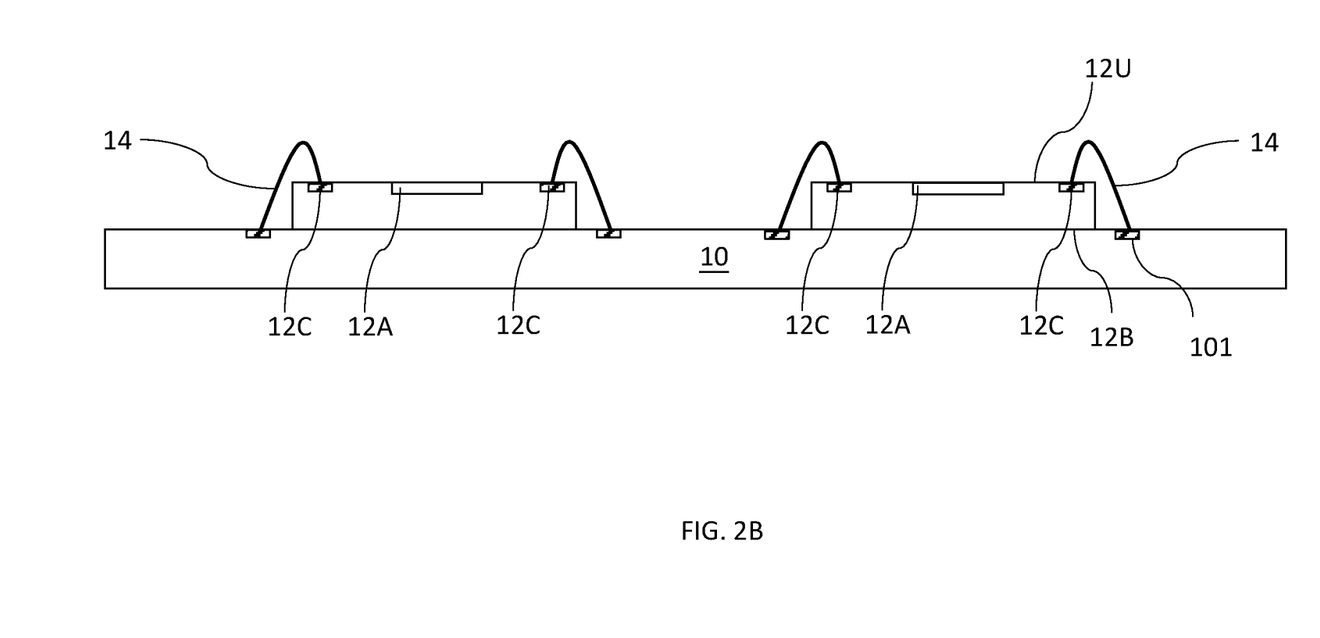

Referring to FIG. 2B, conductive components 14 are formed to electrically connect the contacts 12C of the die 12 to respective bonding pads 101 of the substrate 10. In one or more embodiments, the conductive components 14 are bond wires connected by way of wire-bonds using a wire bonding technique.

Figure 2C:
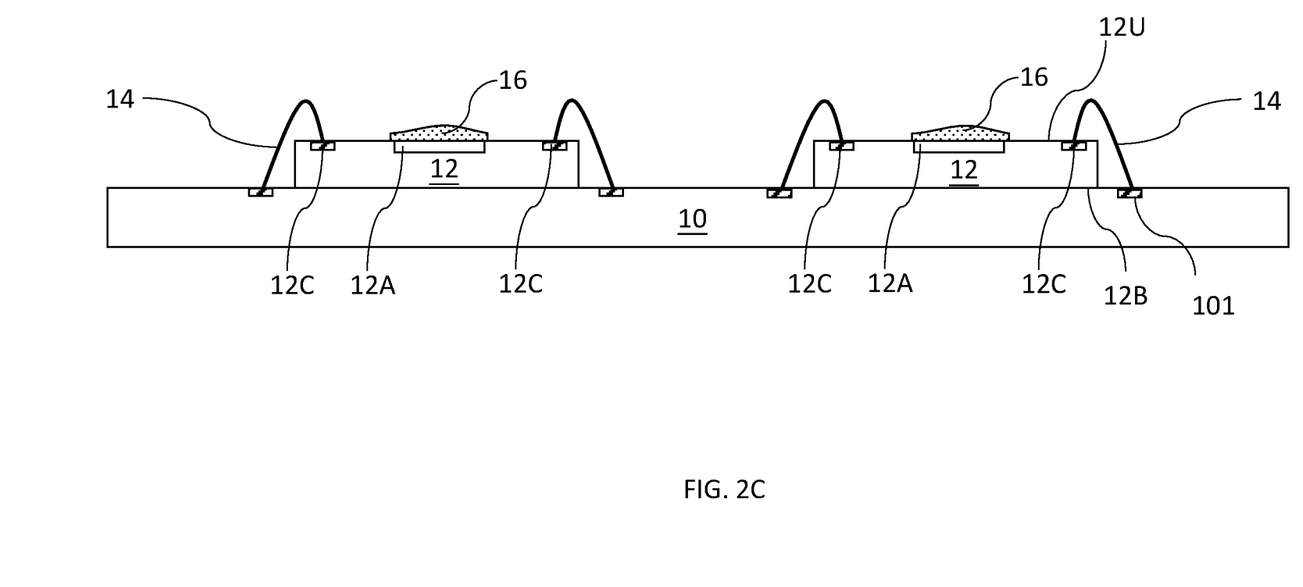

Referring to FIG. 2C, a liquid material 16 is dispensed on the die 12. The liquid material 16 is a flowable material (e.g., liquid resin), which may be dispensed on the die 12, for example, through a nozzle, a syringe, a needle or another suitable apparatus. The liquid material 16 is able to be cured so as to form a protective layer. In one or more embodiments, the liquid material 16 is a photo curable material that can be polymerized when exposed to an electromagnetic radiation beam such as an ultra violet (UV) beam. In one or more embodiments, the liquid material 16 may contain several components, such as, for example, a combination of two or more of photo initiators, monomers, oligomers, modifiers and additives. The photo initiators are able to initiate polymerization when exposed to an electromagnetic radiation of a compatible wavelength such as UV. The monomers are single units of polymers that provide adhesion to the polymer. The oligomers are a backbone of the polymer, which can provide basic properties of the polymer such as hardness, elongation and chemical resistance. The modifiers are used to increase durability of the polymer. The additives are filler chemicals that are used to provide or enhance specific properties such as wetting, tack-free surface or color.

Figure 2D:
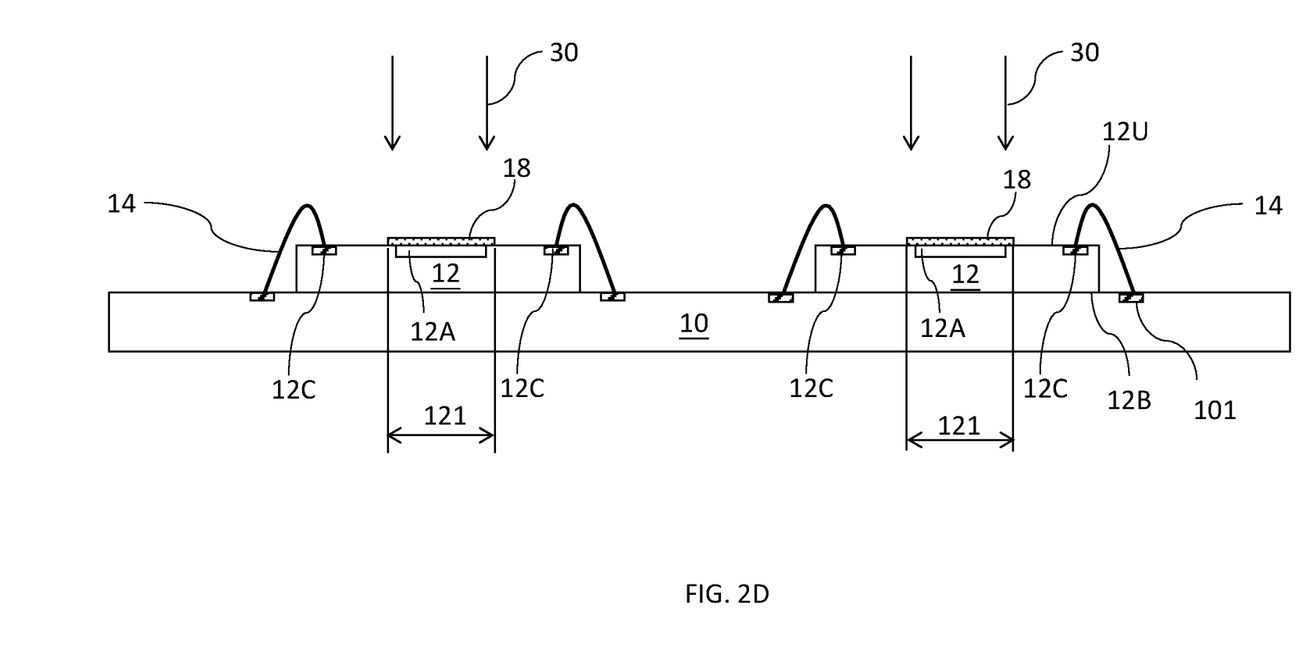

Referring to FIG. 2D, the liquid material 16 is cured by an electromagnetic radiation beam 30 such as a UV beam so that the liquid material 16 is polymerized, forming a protective layer 18 attached to a first portion 121 of the upper surface 12U of each die 12. A dimension (e.g., width, length, or surface area) of the first portion 121 is equal to or greater than a corresponding dimension (e.g., width, length, or surface area) of the optical element 12A such that the protective layer 18 covers and protects the optical element 12A. In one or more embodiments, a baking process may optionally be performed on the protective layer 18 to remove excess solvent. The protective layer 18 is configured as a temporary protective layer to protect the die 12 during subsequent stages of manufacture, and the protective layer 18 is removed at a later stage of manufacture.

Figure 2E:
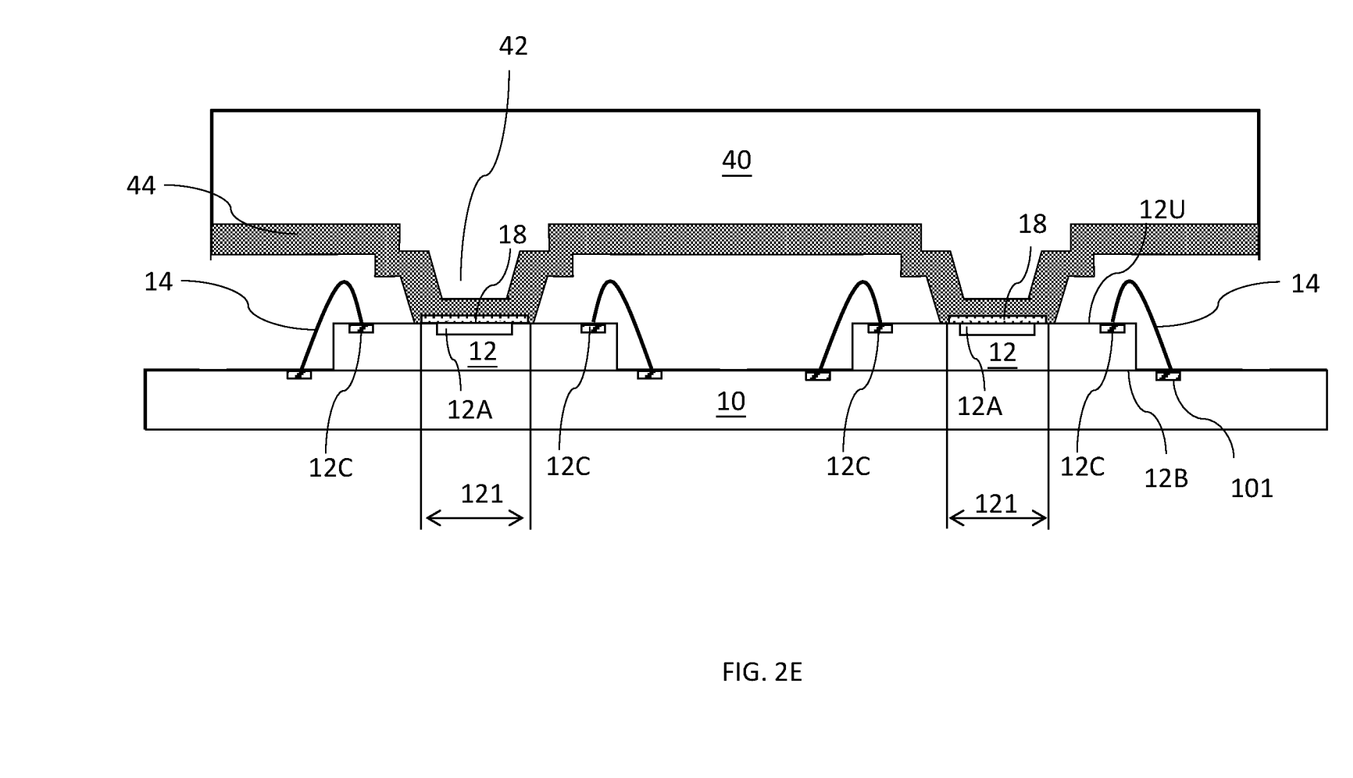

An encapsulant (e.g., a molding member) is formed to cover at least a portion of the substrate 10 and a portion of the die 12, and exposes the protective layer 18. An example of formation of the encapsulant is described with respect to FIGS. 2E-2G. Referring to FIG. 2E, a mold chase 40 having a protrusion 42 is provided. In one or more embodiments, a film 44 is formed on, or applied to, the protrusion 42 or on an entirety of a surface of the mold chase 40. The mold chase 40 with the film 44 is then placed over the substrate 10 and the dies 12, and the protrusion 42 is aligned to be in contact with the protective layer 18 through the film 44. The protective layer 18 and the film 44 are made of flexible materials which can provide a cushion effect, and thus the optical element 12A is not damaged by the protrusion 42 of the mold chase 40 during molding.

Figure 2F:
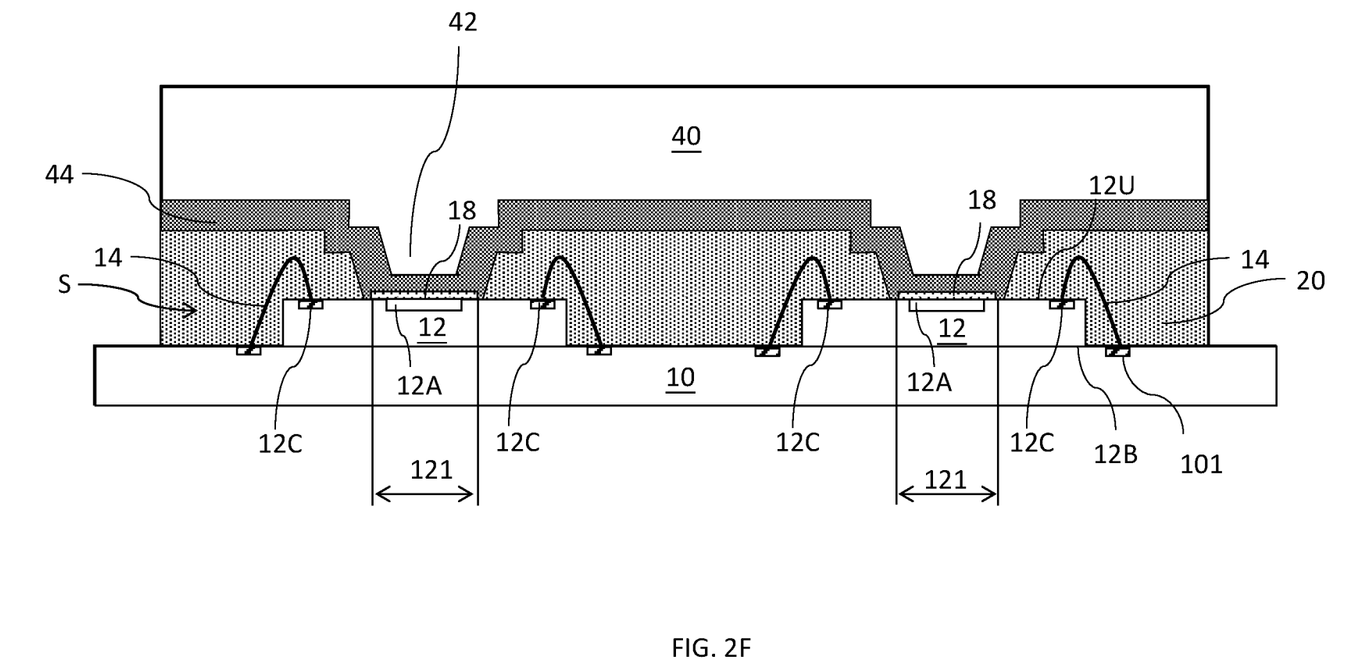

Referring to FIG. 2F, a molding material is filled into a space S between the mold chase 40 and the substrate 10 to form an encapsulant 20. The molding material is in liquid form when applied, and is then solidified to form the encapsulant 20. The encapsulant 20 encapsulates the conductive components 14, protecting the conductive components 14 from being damaged. The protective layer 18 is free of the encapsulant 20.

Figure 2G:
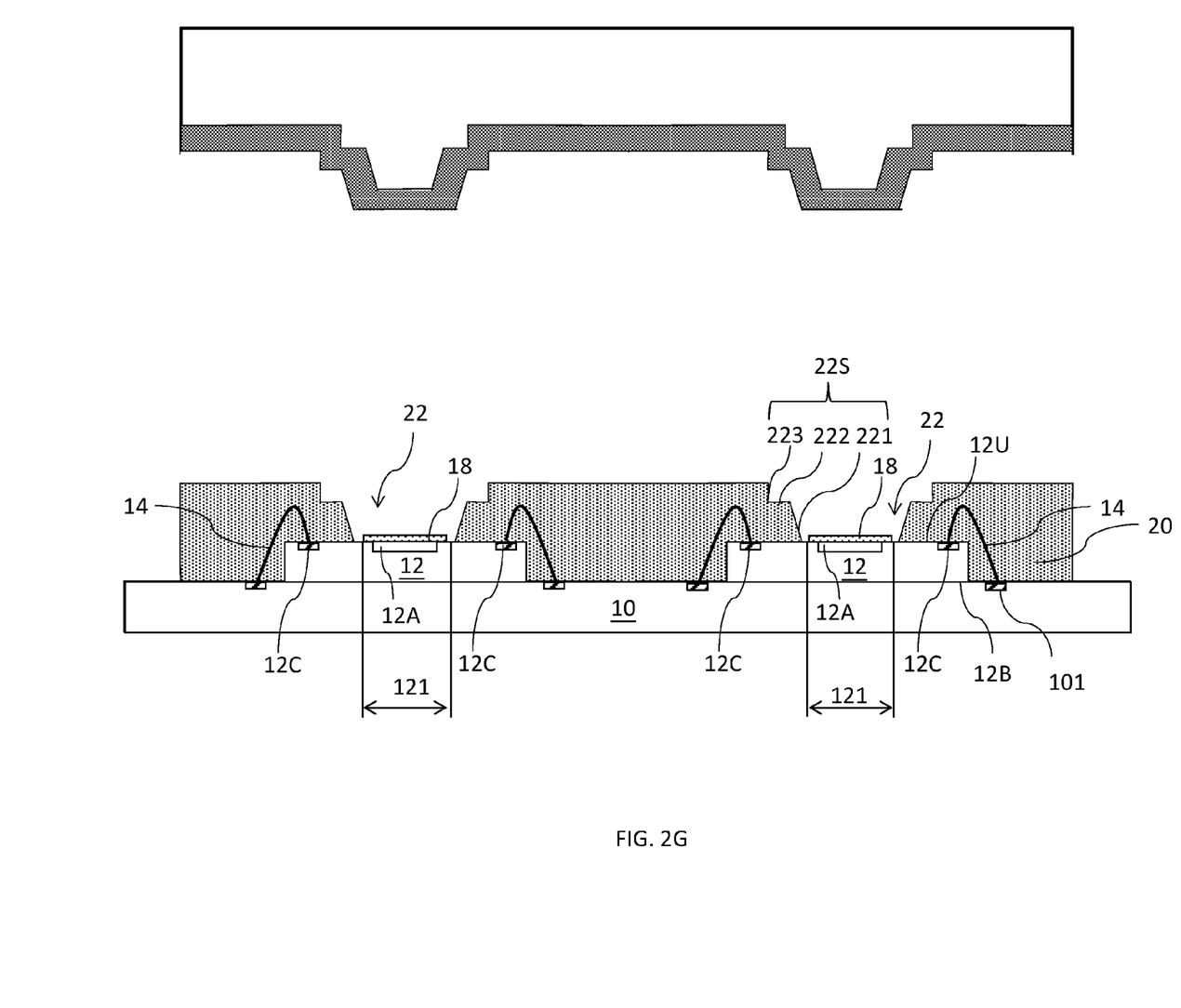

Referring to FIG. 2G, the mold chase 40 with the film 44 is removed from the encapsulant 20. The encapsulant 20 defines a cavity 22 exposing the protective layer 18 and a portion of the upper surface 12U of the die 12. The cavity 22 includes a stepped sidewall 22S including an inclined portion 221, a ledge portion 222, and a vertical portion 223, as described with respect to FIG. 1. Because the encapsulant 20 is formed by a molding technique, dimensions of a semiconductor device package resulting from the described manufacturing technique can be reduced.

Figure 2H:
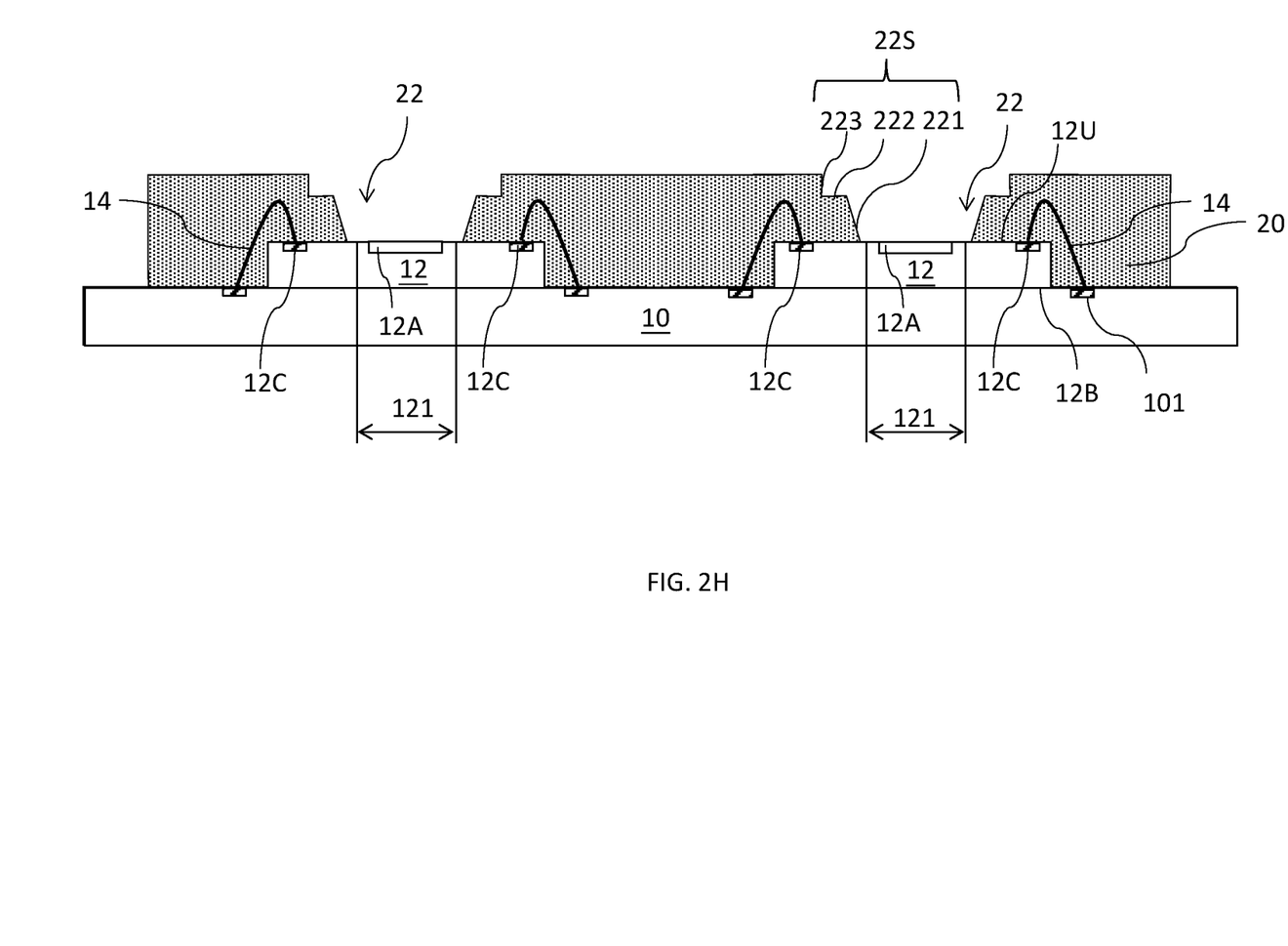

Referring to FIG. 2H, the protective layer 18 is removed from each of the dies 12. In one or more embodiments, the protective layer 18 is heated to reduce adhesion between the protective layer 18 and the die 12 prior to removing the protective layer 18, such that the optical element 12A of the die 12 is not damaged when removing the protective layer 18. For example, the protective layer 18 may be heated by soaking in warm water at a temperature of about 25° C. to about 80° C. In one or more embodiments, the protective layer 18 may be soaked in a solvent at a temperature of about 25° C. to about 80° C. to reduce adhesion between the protective layer 18 and the die 12 prior to removing the protective layer 18 from the die 12. The solvent may include, but is not limited to, propylene glycol monomethyl ether acetate (PGMEA) or 2-propanol, N-methylpyrrolidone (NMP). In one or more embodiments, the protective layer 18 is removed from the die 12 by prying the protective layer 18 from the die 12 (e.g., using a tweezer). In one or more embodiments, the protective layer 18 is removed from the die 12 by blowing the protective layer 18 from the die 12 using a high pressure water jet. In one or more embodiments, the protective layer 18 is removed from the die 12 by separating the protective layer 18 from the die 12 using vacuum suction. A cleaning operation using a solvent may optionally be performed on the die 12 to remove residues subsequent to removing the protective layer 18. The cleaning solvent may include, for example, isopropyl alcohol (IPA).

Figure 2I:
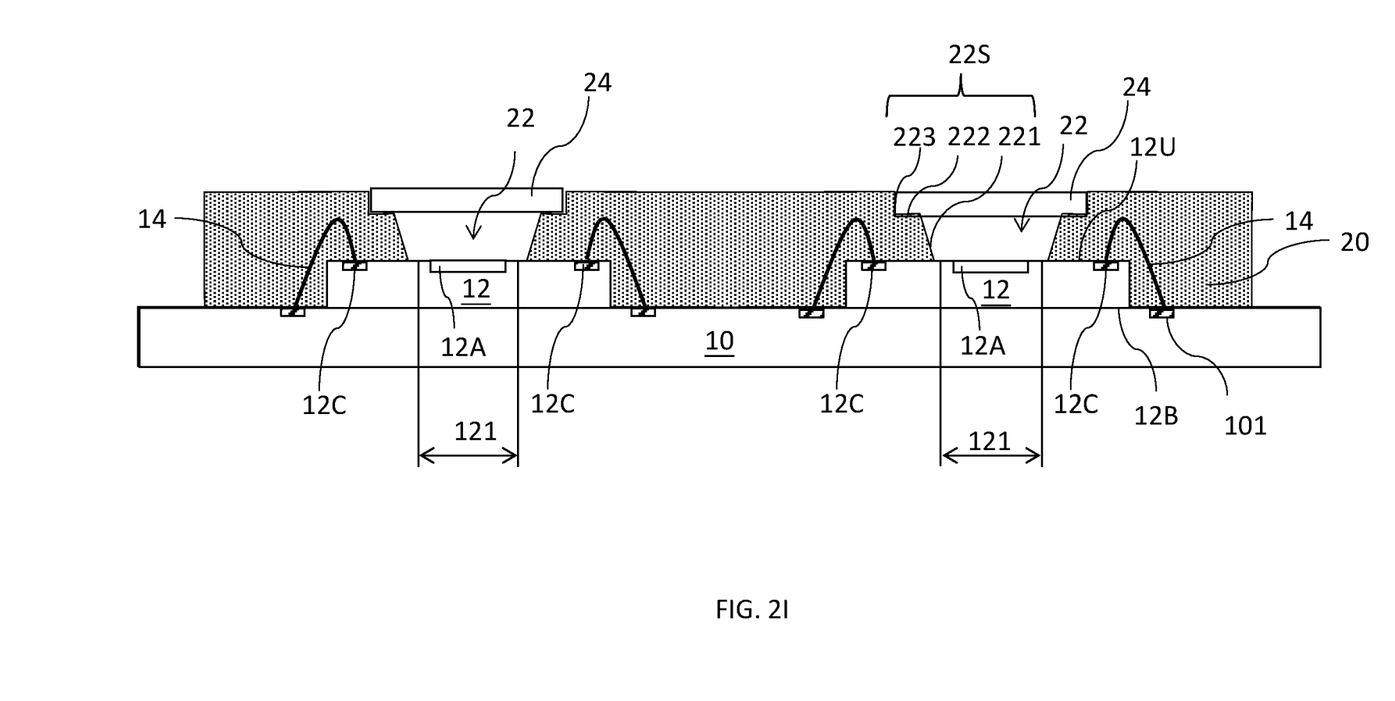

Referring to FIG. 2I, a cap 24 is disposed in the cavity 22 on the ledge portion 222 of the sidewall 22S, and is surrounded by the vertical portion 223 of the sidewall 22S. In one or more embodiments, the cap 24 may be attached to the ledge portion 222 with an adhesive material (not shown). In one or more embodiments, the cap 24 is hermetically sealed to the encapsulant 20 to enclose the cavity 22, thereby inhibiting or preventing moisture and contaminants from entering the cavity 22. In one or more embodiments in which the die 12 is an optoelectronic die, the cap 24 is electromagnetic radiation transmissive, allowing electromagnetic radiation within a predetermined range of wavelengths to pass.

Subsequent to the stage illustrated in FIG. 2I, the substrate 10 may be diced to separate individual semiconductor device packages such as the semiconductor device package 1 shown in FIG. 1.

As illustrated by the foregoing FIGS. 2A-2I, the protective layer 18 is temporarily formed on the die 12 to provide protection to the die 12 during formation of the encapsulant 20, and the protective layer 18 is then removed after the encapsulant 20 is formed (or after the encapsulant 20 is cured). The protective layer 18 is formed of a liquid material such as a liquid resin, which can be cured by photo curing, and can be removed without damaging the die 12. Thus, yield and reliability of the resulting semiconductor device packages can be improved. In addition, the encapsulant 20 is formed by a molding technique, and thus a dimension of the semiconductor device package can be reduced, such as for miniaturization.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Definition of substantially parallel: a range of angular variation about 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Definition of substantially perpendicular: a range of angular variation about 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing a semiconductor device package, comprising:
    disposing at least one die over a substrate;
    dispensing a liquid material on the die;
    curing the liquid material so that the liquid material forms a protective layer attached to a portion of the die;
    forming an encapsulant covering at least a portion of the substrate and a portion of the die free of the protective layer, wherein the protective layer is exposed from the encapsulant in a cavity defined by the encapsulant;
    removing the protective layer from the die; and
    disposing a cap over the cavity.

2. The method of claim 1, wherein curing the liquid material comprises curing the liquid material with an electromagnetic radiation beam.

3. The method of claim 2, wherein the electromagnetic radiation beam comprises a UV beam.

4. The method of claim 1, wherein forming the encapsulant comprises:
    providing a mold chase having a protrusion;
    providing a film on the protrusion;
    placing the mold chase with the film over the substrate and the die with the protrusion in contact with the protective layer through the film;
    filling a molding material into a space between the mold chase and the substrate to form the encapsulant so that the protective layer is free of the encapsulant; and
    removing the mold chase and the film.

5. The method of claim 1, further comprising heating the protective layer to reduce adhesion between the protective layer and the die prior to removing the protective layer.

6. The method of claim 5, wherein heating the protective layer comprises soaking the protective layer in warm water.

7. The method of claim 1, further comprising soaking the protective layer in a solvent to reduce adhesion between the protective layer and the die prior to removing the protective layer from the die.

8. The method of claim 1, wherein removing the protective layer from the die comprises prying the protective layer from the die.

9. The method of claim 1, wherein removing the protective layer from the die comprises blowing the protective layer from the die.

10. The method of claim 1, wherein removing the protective layer from the die comprises separating the protective layer from the die using vacuum suction.

11. A method of manufacturing an optoelectronic device package, comprising:
    disposing at least one optoelectronic die over a substrate, the optoelectronic die comprising an optical element;

dispensing a resin material on the optoelectronic die;
curing the resin material so that the resin material forms a protective layer covering the optical element of the optoelectronic die;
forming a molding member defining a cavity over the substrate and the optoelectronic die, the cavity exposing the protective layer;
removing the protective layer from the die; and
disposing an electromagnetic radiation transmissive cap over the cavity.

12. The method of claim 11, further comprising heating the protective layer to reduce adhesion between the protective layer and the optoelectronic die prior to removing the protective layer.

13. The method of claim 11, further comprising soaking the protective layer in a solvent to reduce adhesion between the protective layer and the optoelectronic die prior to removing the protective layer.

14. The method of claim 11, wherein removing the protective layer from the optoelectronic die comprises prying the protective layer from the optoelectronic die.

15. The method of claim 11, wherein removing the protective layer from the optoelectronic die comprises blowing the protective layer from the optoelectronic die.

16. The method of claim 11, wherein removing the protective layer from the optoelectronic die comprises separating the protective layer from the optoelectronic die using vacuum suction.

17. The method of claim 11, further comprising forming a plurality of conductive components to electrically connect the optoelectronic die to the substrate prior to forming the molding member, wherein the molding member encapsulates the conductive components.

18. A semiconductor device package, comprising:
a substrate;
at least one die disposed over the substrate;
a plurality of conductive components electrically connecting the die to the substrate;
an encapsulant disposed over the substrate, the encapsulant defining a cavity partially exposing an upper surface of the die, the cavity including a stepped sidewall, the stepped sidewall including:
an inclined portion extending to the upper surface of the die, the inclined portion inclined outwardly with respect to the upper surface of the die;
a vertical portion extending from an upper surface of the encapsulant, the vertical portion being substantially perpendicular to the upper surface of the encapsulant; and
a ledge portion between the vertical portion and the inclined portion and substantially parallel to the upper surface of the encapsulant; and
an electromagnetic radiation transmissive cap on the ledge portion and surrounded by the vertical portion.

19. The semiconductor device package of claim 18, wherein the conductive components comprise a plurality of bond wires, and the encapsulant encapsulates the bond wires.

20. The semiconductor device package of claim 18, wherein the die comprises an optical element, and the encapsulant encapsulates a portion of the die and exposes the optical element.

* * * * *